United States Patent
Yotsuya

(10) Patent No.: US 6,875,542 B2
(45) Date of Patent: *Apr. 5, 2005

(54) MASK AND METHOD OF MANUFACTURING THE SAME, ELECTROLUMINESCENCE DEVICE AND METHOD OF MANUFACTURING THE SAME, AND ELECTRONIC INSTRUMENT

(75) Inventor: Shinichi Yotsuya, Suwa (JP)

(73) Assignee: Seiko Epson Corporation, Tokyo (JP)

(*) Notice: Subject to any disclaimer, the term of this patent is extended or adjusted under 35 U.S.C. 154(b) by 306 days.

This patent is subject to a terminal disclaimer.

(21) Appl. No.: 10/247,570

(22) Filed: Sep. 20, 2002

(65) Prior Publication Data

US 2003/0059690 A1 Mar. 27, 2003

(30) Foreign Application Priority Data

Sep. 25, 2001 (JP) .................................... 2001-292040

(51) Int. Cl.⁷ .............................. G03F 9/00; G03C 5/00
(52) U.S. Cl. ............................... 430/5; 430/7; 430/22; 430/23; 430/322
(58) Field of Search .......................... 430/5, 322, 22, 430/7, 23

(56) References Cited

U.S. PATENT DOCUMENTS 6,720,236 B2 * 4/2004 Yotsuya ...................... 438/455
2003/0054646 A1 * 3/2003 Yotsuya ...................... 438/689
2004/0166652 A1 * 8/2004 Yotsuya ........................ 430/5

FOREIGN PATENT DOCUMENTS

| JP | 53-79775 | 7/1978 |
|---|---|---|
| JP | A 57-126967 | 8/1982 |
| JP | U 61-2450 | 1/1986 |
| JP | A 10-204615 | 8/1998 |
| JP | A 2001-118780 | 4/2001 |
| JP | A 2001-181822 | 7/2001 |
| JP | A 2001-185350 | 7/2001 |
| JP | A 2001-230194 | 8/2001 |
| JP | A 2001-237073 | 8/2001 |
| JP | A 2001-246599 | 9/2001 |
| JP | A 2002-47560 | 2/2002 |

* cited by examiner

*Primary Examiner*—Geraldine Letscher
(74) *Attorney, Agent, or Firm*—Oliff & Berridge, PLC

(57) ABSTRACT

A method of manufacturing a mask includes attaching to a first substrate formed with an opening a second substrate formed with a plurality of penetrating holes. The plurality of penetrating holes are disposed inside the opening. The first substrate and the second substrate may be joined together by anode coupling. First and second alignment marks may be used for positioning the second substrate and the first substrate when attaching the second substrate to the first substrate.

22 Claims, 10 Drawing Sheets

MASK AND METHOD OF MANUFACTURING THE SAME, ELECTROLUMINESCENCE DEVICE AND METHOD OF MANUFACTURING THE SAME, AND ELECTRONIC INSTRUMENT

Japanese Patent Application No. 2001-292040 filed on Sep. 25, 2001 is hereby incorporated by reference in its entirety.

BACKGROUND OF THE INVENTION

The present invention relates to a mask and a method of manufacturing the same, an electroluminescence device and a method of manufacturing the same, and an electronic instrument.

Highly fine masks are demanded. For example, in fabrication processes of color organic electroluminescence (hereafter, it is called EL) devices, it is known that organic materials of separate colors are formed by vapor deposition with the use of a mask. As a mask fabrication method, a method of etching base materials is known, but masks manufactured by this method have had a problem that warp and bending are generated because they are very thin.

BRIEF SUMMARY OF THE INVENTION

A method of manufacturing a mask according to one aspect of the present invention includes:

attaching to a first substrate formed with an opening a second substrate formed with a plurality of penetrating holes, wherein the plurality of penetrating holes are disposed inside the opening.

A mask according to another aspect of the present invention includes:

a first substrate formed with an opening; and a second substrate formed with a plurality of penetrating holes and attached to the first substrate, wherein the plurality of penetrating holes are disposed inside the opening.

An EL device according to a further aspect of the present invention includes forming a film of luminescent material by using the above mask.

An EL device according to a still further aspect of the present invention is manufactured by using the above method.

An electronic instrument according to a yet further aspect of the present invention includes the above EL device.

DETAILED DESCRIPTION OF THE EMBODIMENT

Figure 1A:
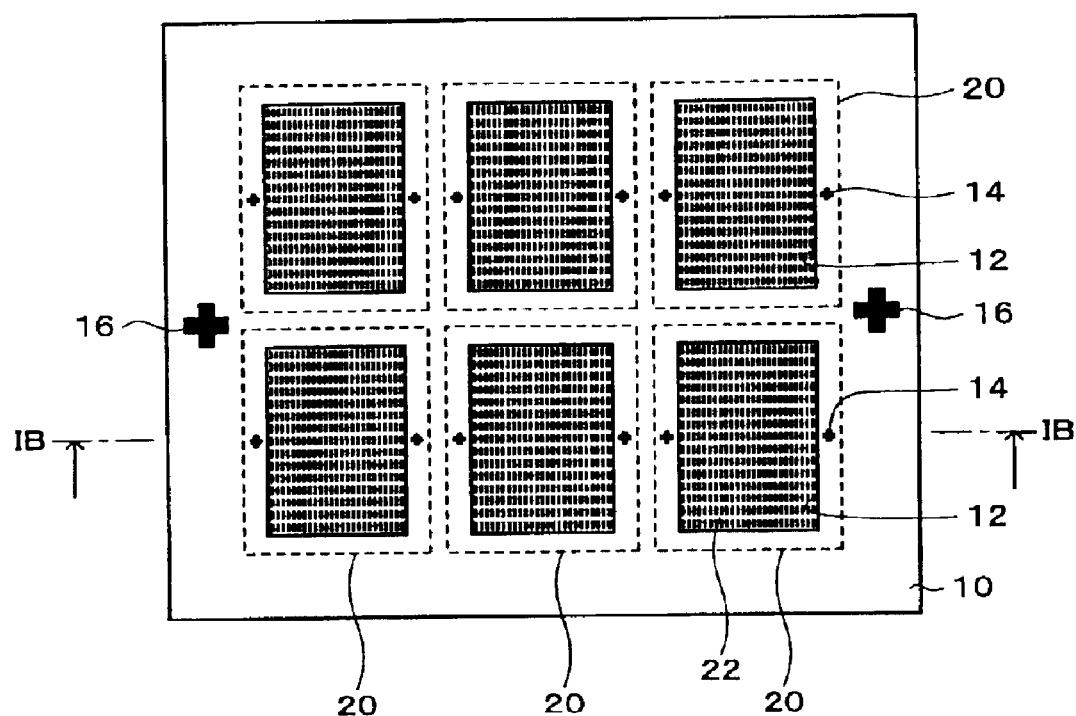
FIGS. 1A and 1B illustrate a mask according to an embodiment of the present invention.

The present invention may provide a mask with high strength and a method of manufacturing the same, an EL device and a method of manufacturing the same, and an electronic instrument.

(1) The method of manufacturing the mask according to one embodiment of the present invention includes:

attaching to a first substrate formed with an opening a second substrate formed with a plurality of penetrating holes, wherein the plurality of penetrating holes are disposed inside the opening.

According to the embodiment of the present invention, the first substrate reinforces the second substrate, and thus the mask with high strength can be manufactured.

(2) In the method of manufacturing the mask, the first substrate and the second substrate may be joined together by anode coupling.

Here, anode coupling is a joining method that generates electrostatic attraction in the coupling interface by applying voltage and generates the chemical bond in the coupling interface.

(3) In the method of manufacturing the mask, the first substrate and the second substrate may be adhered together by an energy curable adhesive.

Here, energy includes lights (ultraviolet rays, infrared rays, and visible lights), radiations such as X-rays, and heat. Accordingly, energy can be applied after the positioning of the first and second substrates. Thus, the alignment of the first substrate with the second substrate can be facilitated.

(4) In the method of manufacturing the mask, a step of forming the second substrate may include:

forming the plurality of penetrating holes in a silicon wafer; and cutting the silicon wafer into an outer shape of the second substrate.

(5) In the method of manufacturing the mask, the first substrate may have a first alignment mark, the second substrate may have a second alignment mark, and the first and second alignment marks may be used for positioning the second substrate and the first substrate when attaching the second substrate to the first substrate.

(6) The method of manufacturing the mask may further include forming a mask positioning mark in at least one of the first and second substrates.

Here, the mask positioning mark is used for mask alignment when the mask is used in vapor deposition.

(7) The method of manufacturing the mask may further include forming a magnetic film over the second substrate.

Accordingly, the mask attractable by magnetic force can be manufactured.

(8) In the method of manufacturing the mask, a plurality of the second substrates may be attached to the first substrate, the first substrate may be formed with a plurality of the openings, and each of the second substrates may correspond with each of the openings when attaching the second substrates to the first substrate.

Accordingly, a large-sized mask (mask combined with a plurality of masks) can be manufactured.

(9) In the method of manufacturing the mask, the plurality of second substrates may be detachably attached to the first substrate.

Accordingly, individual broken second substrates can be replaced, thus being economical.

(10) The method of manufacturing the mask may further include polishing surfaces of the plurality of second substrates attached to the first substrate so that heights of the second substrates become equal.

Accordingly, the surfaces of the plurality of second substrates are planarized, and thus the adhesion to an object for vapor deposition can be enhanced.

(11) A mask according to another embodiment of the present invention includes:

a first substrate formed with an opening; and a second substrate formed with a plurality of penetrating holes and attached to the first substrate, wherein the plurality of penetrating holes are disposed inside the opening.

According to the embodiment of the present invention, the second substrate is reinforced by the first substrate, and thus the warp and bending of the second substrate can be eliminated.

(12) In this mask, the first substrate and the second substrate may be joined together by anode coupling.

Here, anode coupling is a joining method that generates electrostatic attraction in the coupling interface by applying voltage and generates the chemical bond in the coupling interface.

(13) In the mask, the first substrate and the second substrate may be adhered together by an energy curable adhesive.

(14) In the mask, the first substrate may have a first alignment mark, the second substrate may have a second alignment mark, and the first and second alignment marks may be used for positioning the second substrate and the first substrate.

(15) In the mask, a mask positioning mark may be formed in at least one of the first and second substrates.

Here, the mask positioning mark is used for mask alignment when the mask is used in vapor deposition.

(16) In the mask, a magnetic film may be formed over the second substrate.

Accordingly, the second substrate can be attracted by magnetic force.

(17) In the mask, a plurality of the second substrates may be attached to the first substrate, the first substrate may be formed with a plurality of the openings, and each of the second substrates may correspond with each of the openings when attaching the second substrates to the first substrate.

This mask is combined with a plurality of masks, thus forming a large-sized mask.

(18) In the mask, the plurality of second substrates may be detachably attached to the first substrate.

Accordingly, individual broken second substrates can be replaced, thus being economical.

(19) In the mask, surfaces of the plurality of second substrates attached to the first substrate may be polished so that heights of the second substrates become equal.

Accordingly, the surfaces of the plurality of second substrates are planarized, and thus the adhesion to an object for vapor deposition can be enhanced.

(20) A method of manufacturing an EL device according to a further embodiment of the present invention includes forming a film of luminescent material by using the above mask.

(21) The EL device according to a still further embodiment of the present invention is manufactured by the method described above.

(22) An electronic instrument according to a yet further embodiment of the present invention has the above EL device.

Hereafter, the preferred embodiment of the present invention will be described with reference to the drawings.

Figure 1B:
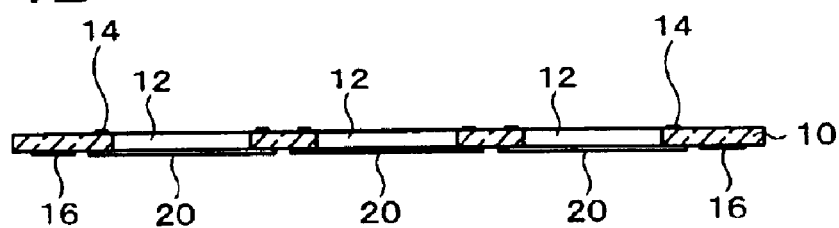
Figure 2A:
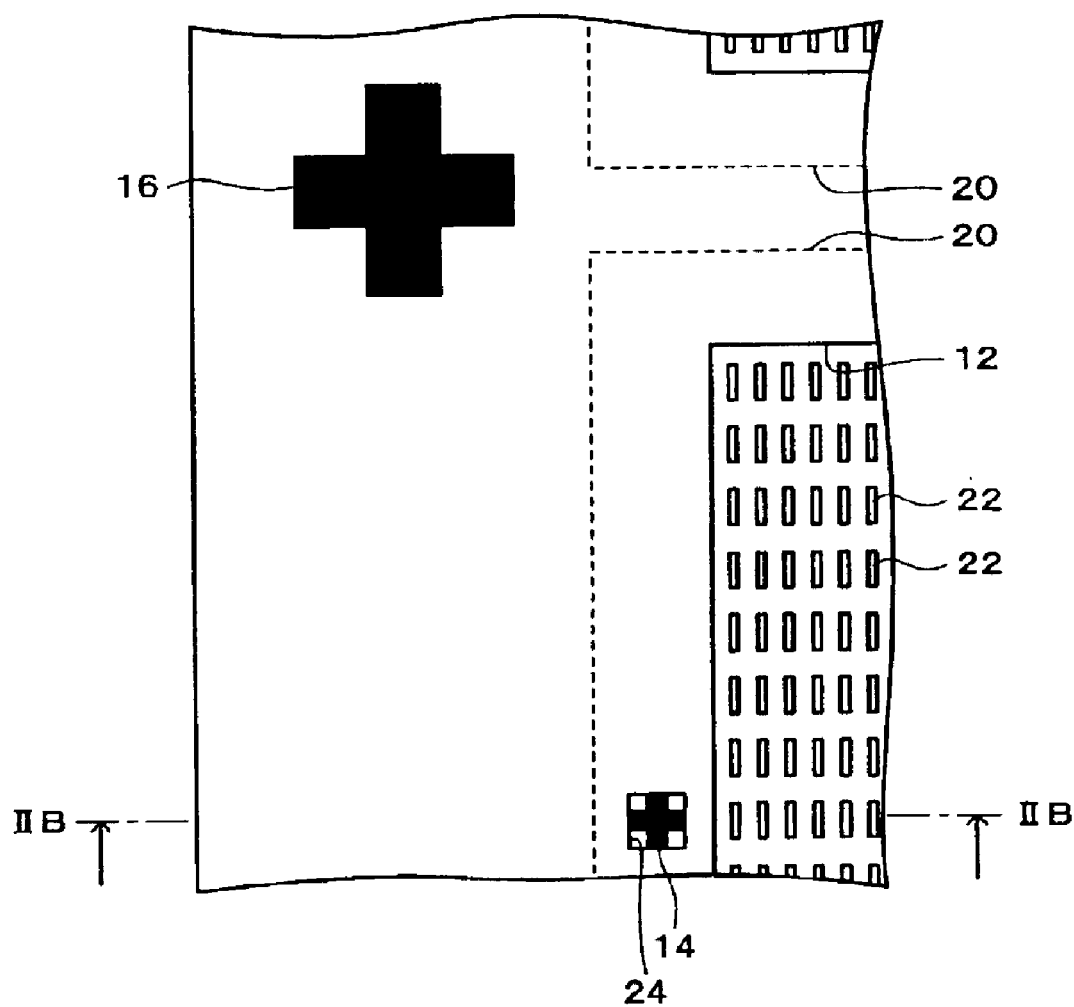
FIGS. 2A and 2B are enlarged diagrams of the mask according to the embodiment of the present invention.
Figure 2B:
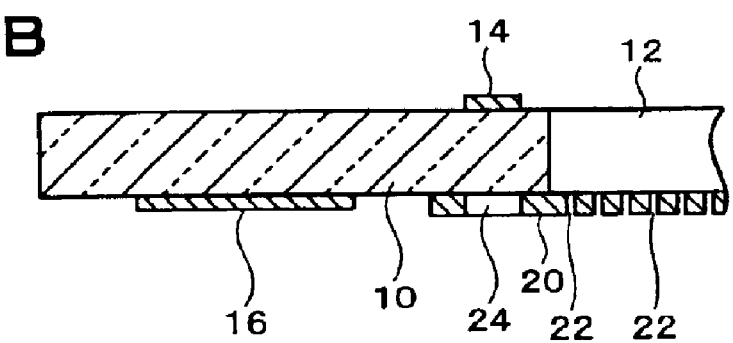
Figure 3:
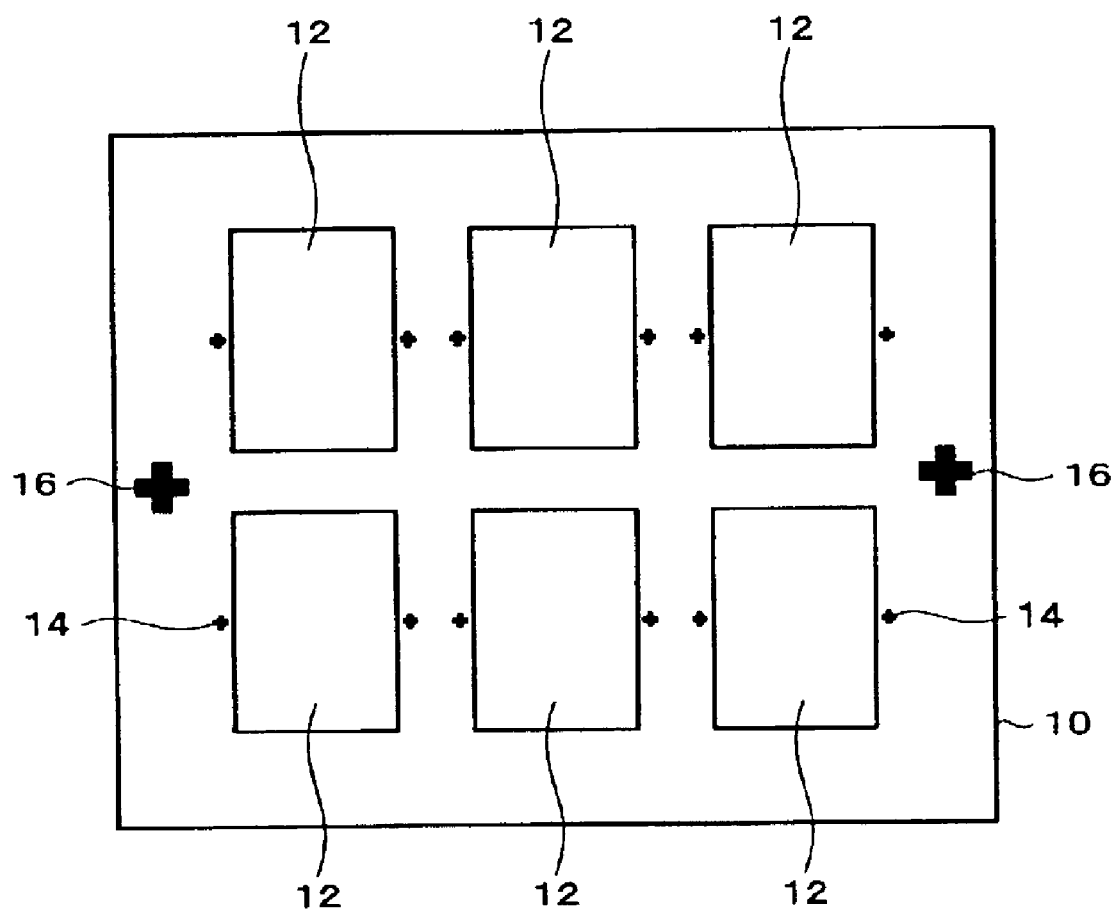
FIG. 3 shows a first substrate.
Figure 4:
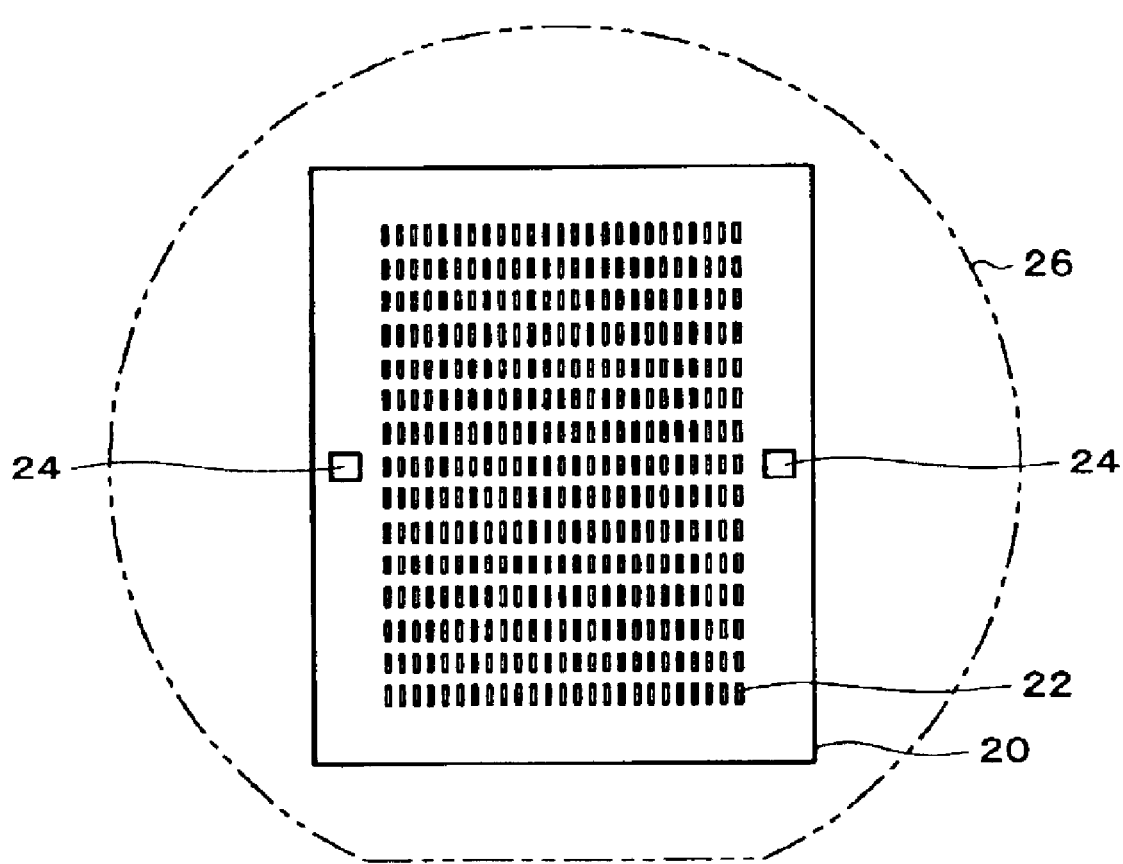
FIG. 4 shows a second substrate.

FIGS. 1A and 1B illustrate a mask according to the embodiment of the present invention. FIG. 1B is a cross sectional view along a line IB—IB shown in FIG. 1A. FIGS. 2A and 2B are enlarged diagrams of the mask according to the embodiment of the present invention. FIG. 2B is a cross sectional view along a line IIB—IIB shown in FIG. 2A. The mask has a first substrate 10 and at least one second substrate 20 (it is plurals in the example shown in FIG. 1A). FIG. 3 shows the first substrate, and FIG. 4 shows the second substrate.

The first substrate 10 may be a transparent substrate. The first substrate 10 is formed of a material that allows anode coupling to the second substrate 20 (for example, borosilicate glass) in this embodiment. The first substrate 10 is formed with at least one opening 12 (it is plurals in the example shown in FIG. 1A). The first substrate 10 can be said a frame. The opening 12 is smaller than the second substrate 20. However, the opening 12 is greater than the area where a plurality of penetrating holes 22 is formed in the second substrate 20. The opening 12 may be rectangular.

The first substrate 10 is formed with first alignment marks 14. The first alignment mark 14 is used for alignment with the second substrate 20. The first alignment mark 14 can be formed of a metal film, or it may be formed by etching. The first substrate 10 is formed with mask positioning marks 16. The mask positioning mark 16 is used for mask alignment when the mask is used in vapor deposition. The mask positioning mark 16 can also be formed of a metal film. As a modified example, the mask positioning marks 16 may be formed in the second substrate 20.

The second substrate 20 may be rectangular. The second substrate 20 is formed with a plurality of penetrating holes 22 (see FIGS. 2A and 2B). The shape of the penetrating hole 22 may be any of square, parallelogram and circle. The shape, arrangement and numbers of the penetrating holes 22 form a mask pattern. The second substrate 20 can be said a screen plate.

The second substrate 20 is formed with second alignment marks 24. The first substrate 10 is aligned with the second substrate 20 with the use of the first and second alignment marks 14 and 24. The second alignment marks 24 can be formed by etching the second substrate 20, or they may be formed of a metal film.

The second substrate 20 is attached to the first substrate 10. As shown in FIG. 2A, the second substrate 20 is attached so that the plurality of penetrating holes 22 is arranged inside the opening 12. In addition, the end part of the second substrate 20 is attached to the end part of the opening 12 of the first substrate 10. More specifically, the entire peripheral portion (rectangular edge portion) of the second substrate 20 is attached to the entire peripheral portion (rectangular edge portion) of the opening of the first substrate 10. One second substrate 20 is disposed corresponding to one opening 12. The second substrate 20 is attached to the surface opposite to the surface where the first alignment marks 14 are formed in the first substrate 10. In this embodiment, the first substrate 10 is joined to the second substrate 20 by anode coupling. The second substrate 20 is formed of a material that allows anode coupling to the first substrate 10 (silicon, for example).

Figure 5A:
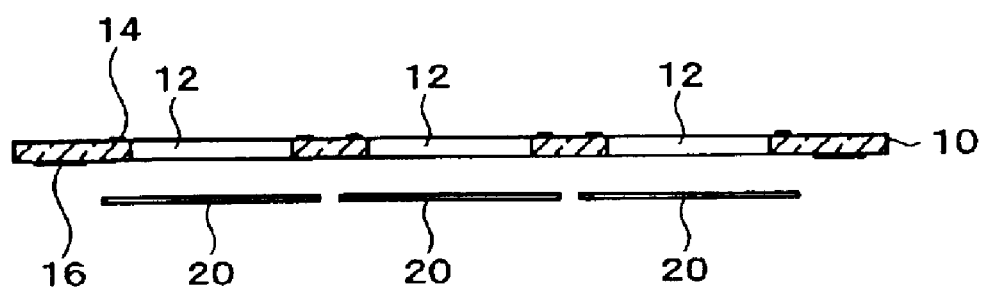
FIGS. 5A and 5B illustrate a method of manufacturing the mask according to the embodiment of the present invention.
Figure 5B:
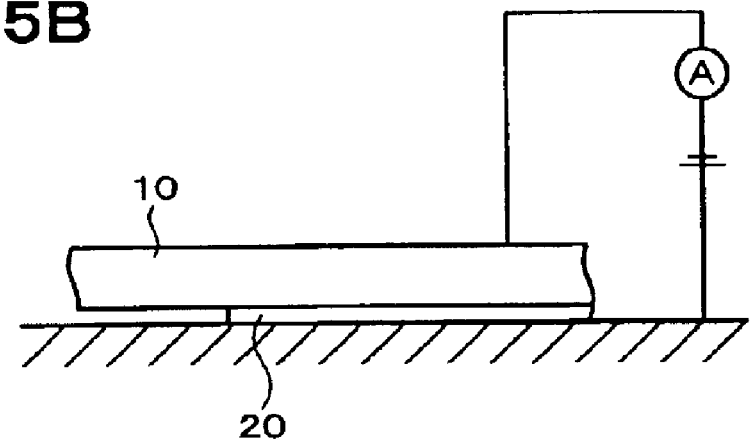

FIGS. 5A and 5B illustrate a method of manufacturing the mask according to the embodiment of the present invention. In this embodiment, the first and second substrates 10 and 20 are prepared. To form the openings 12 in the first substrate 10, sandblasting maybe applied. To form the first alignment marks 14 or mask positioning marks 16 in the first substrate 10, sputtering or vapor deposition may be applied or etching may be applied.

The plurality of penetrating holes 22 is formed in the second substrate 20. To form them, etching may be applied (anisotropic etching with the dependency of crystal face orientation). The walls of the penetrating hole 22 may be vertical to the surface of the second substrate 20 or may be tapered. As shown in FIG. 4, it is acceptable to form the second substrate 20 of a silicon wafer 26. In this case, it is acceptable to cut the silicon wafer 26 into the second substrate 20. To form the second alignment marks 24 in the second substrate 20, etching may be applied, or sputtering or vapor deposition may be applied.

As shown in FIG. 5A, the first substrate 10 is aligned with the second substrates 20 for arrangement. The plurality of second substrates 20 is arranged not to overlap each other. Over one surface of the first substrate 10, the plurality of second substrates 20 is disposed. For alignment, the first and second alignment marks 14 and 24 are used. The details of the positions are as described above.

As shown in FIG. 5B, the first and second substrates 10 and 20 are attached together. The second substrate 20 is reinforced by the first substrate 10, and thus the mask with high strength can be manufactured. In this embodiment, anode coupling is applied. More specifically, the coupling surfaces of the first and second substrates 10 and 20 are faced each other and disposed, they are heated at temperatures of about 300 to 500° C., and a voltage of about 500V is applied. When the first substrate 10 is formed of borosilicate glass (Corning #7740 Pyrex® glass, for example) and the second substrate 20 is formed of silicon, the first substrate 10 is connected to a negative pole. Then, positive ions (sodium ions) of the first substrate 10 are moved to the negative pole direction, and the surface of the first substrate 10 facing to the second substrate 20 becomes negatively charged. In the meantime, the surface of the second substrate 20 facing to the first substrate 10 becomes positively charged. In this manner, the first and second substrates 10 and 20 are attracted each other by electrostatic attraction to generate chemical bond for coupling.

The thermal expansion coefficient of the Corning #7740 (Pyrex® glass) is about 3.5 ppm/° C., close to the thermal expansion coefficient of silicon forming the second substrate 20. Therefore, even though the mask is used under high temperatures, the warp and distortion are so small that they can be ignored. Furthermore, adhesives are not used in anode coupling. Thus, the distortion due to shrinkage on curing does not occur, and gases are not generated. As described above, the mask in this embodiment is optimal for vapor deposition at high vacuum.

Figure 6:
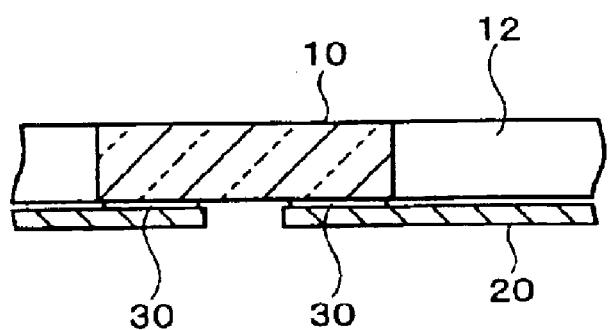
FIG. 6 illustrates a modification of the embodiment of the present invention.

Additionally, the present invention does not exclude joining with adhesives. FIG. 6 illustrates a modification of the embodiment of the present invention. In this modification, a first substrate 10 is joined to a second substrate 20 with an adhesive 30. It is acceptable that the adhesive 30 is an energy curable adhesive. Energy includes lights (ultraviolet rays, infrared rays and visible lights), radiations such as X-rays, and heat. Accordingly, the first and second substrates 10 and 20 are aligned with each other and then energy can be applied, facilitating the alignment of the first substrate 10 with the second substrates 20.

Figure 7:
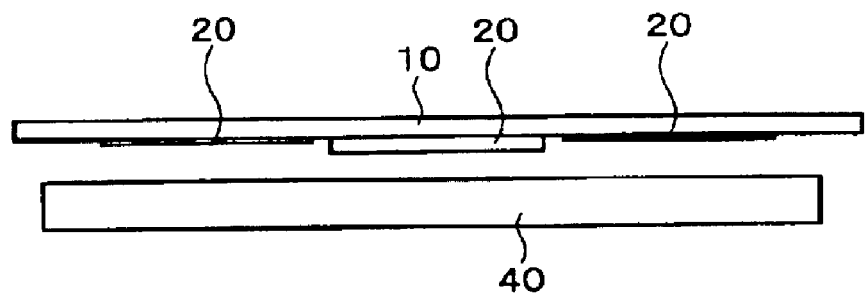
FIG. 7 illustrates the method of manufacturing the mask according to the embodiment of the present invention.

According to the processes, the first substrate 10 can be attached with the second substrates 20. As shown in FIG. 7, when the plurality of second substrates 20 has uneven height because of variations in the substrate thickness, the surface of the second substrates 20 may be polished by a grindstone 40. Accordingly, the surface of the plurality of second substrates 20 is planarized, and thus the adhesion to an object for vapor deposition can be enhanced.

Figure 8:
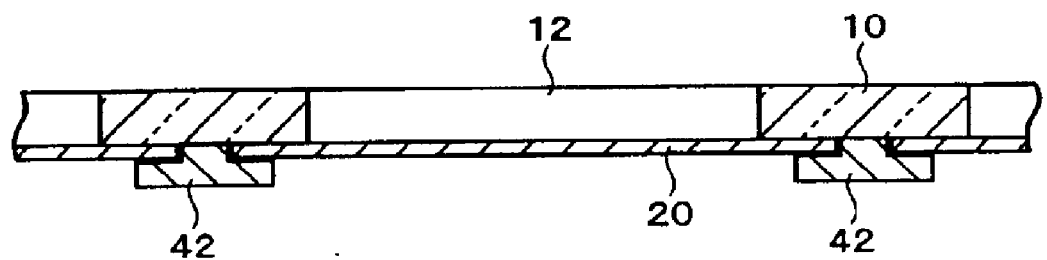
FIG. 8 shows another modification of the embodiment of the present invention.

FIG. 8 shows another modification of the embodiment of the present invention. In this modification, a second substrate 20 is attached to a first substrate 10. For example, mounting parts 42 are disposed on the first substrate 10 to form guide grooves, and the second substrates 20 may be fit into the guide grooves. Additionally, the second substrate 20 may be fixed or intended not to come off by screws not shown. Accordingly, individual broken second substrates 20 can be replaced, thus being economical.

Figure 9A:
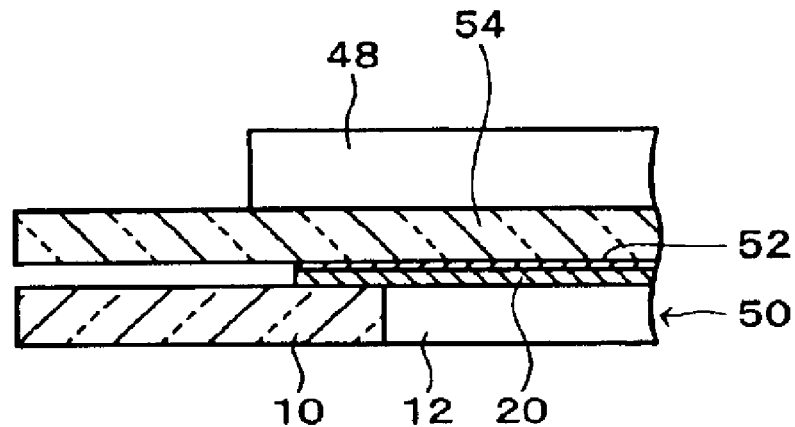
FIGS. 9A and 9B illustrate a method of manufacturing the mask and an EL device according to an embodiment of the present invention.
Figure 9B:
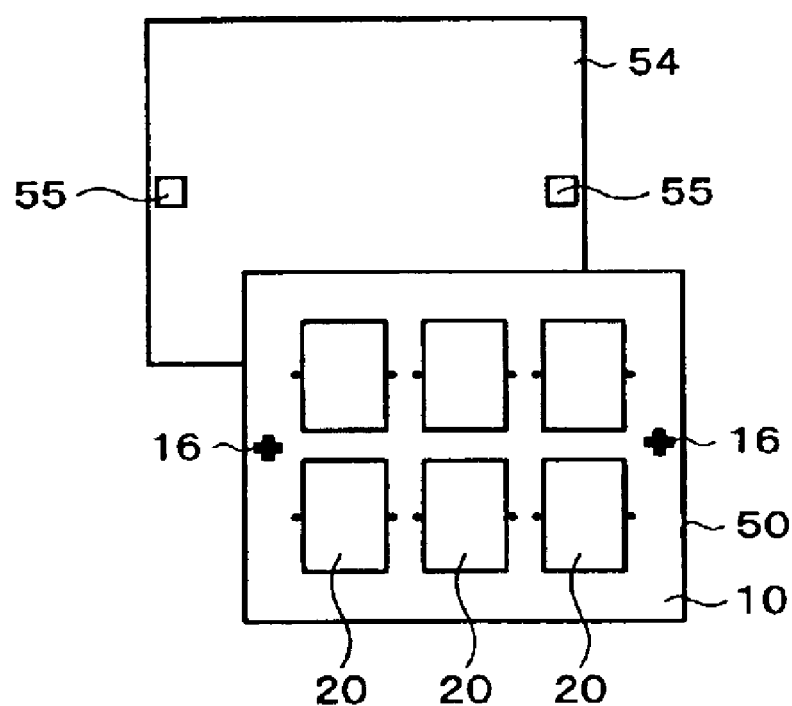

FIGS. 9A and 9B illustrate a method of manufacturing the mask and an EL device in the embodiment of the present invention. A magnetic film 52 is formed over a mask 50 shown in FIG. 9A (a second substrate 20, for example). The magnetic film 52 can be formed of ferromagnetic materials such as iron, cobalt and nickel. Alternatively, the magnetic film 52 may be formed of magnetic metal materials such as Ni, Co and Fe, or a stainless alloy containing Fe, or it may be formed by joining magnetic metal materials to non-magnetic metal materials. The other details of the mask 50 have been described in the first embodiment.

Figure 10A:
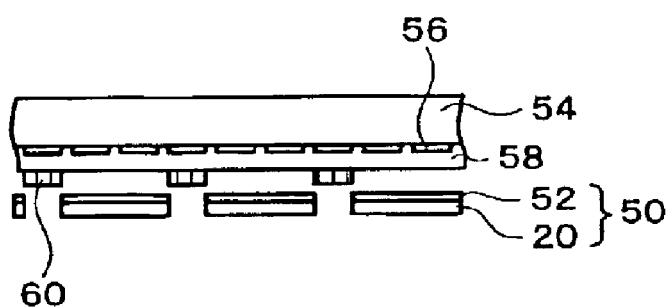
FIGS. 10A to 10C illustrate a method of depositing luminescent materials.

In this embodiment, the mask 50 is used to deposit luminescent materials over a substrate 54. The substrate 54 is used for manufacturing a plurality of EL devices (organic EL devices, for example), which is a transparent substrate such as a glass substrate. As shown in FIG. 10A, electrodes (transparent electrodes formed of ITO, for example) 56 and a hole transport layer 58 are formed over the substrate 54. Additionally, an electron transport layer may be formed.

As shown in FIG. 9A, the mask 50 is disposed so as to place the second substrate 20 on the substrate 54 side. A magnet 48 is disposed on the backside of the substrate 54, which attracts the magnetic film 52 formed on the mask 50 (the second substrate 20). Accordingly, even though a warp is generated in the mask 50 (the second substrate 20), it can be corrected.

FIG. 9B illustrates a method of mask alignment. As described above, the first substrate 10 is formed with the mask positioning marks 16, whereas the substrate 54 is also formed with positioning marks 55. The mask positioning marks 16 and the positioning marks 55 are used to align the first substrate 10 with the substrate 54.

Figure 10B:
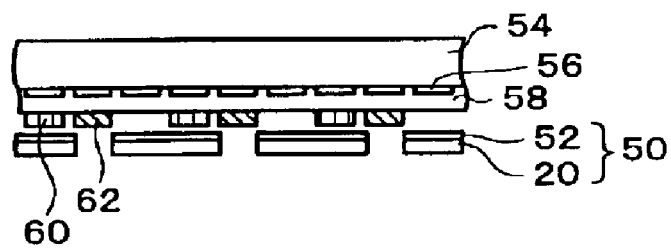
Figure 10C:
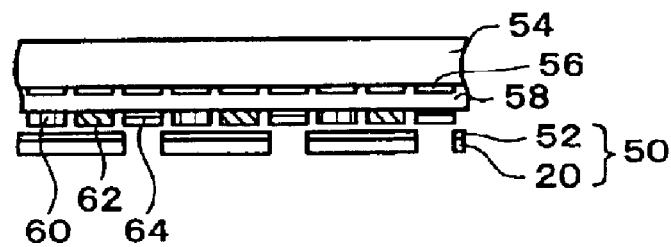

FIGS. 10A and 10C illustrate a method of depositing luminescent materials. The luminescent materials are organic materials, for example. There are alumiquinolinol complex ($Alq_3$) as a low molecular organic material, and poly(p-phenylenevinylene (PPV) as a high polymer organic material. Deposition of the luminescent materials can be performed by vapor deposition. For example, as shown in FIG. 10A, a red luminescent material is patterned and deposited through the mask 50 to form a red luminescent layer 60. Then, as shown in FIG. 10B, the mask 50 is shifted and a green luminescent material is patterned and deposited to form a green luminescent layer 62. Subsequently, as shown in FIG. 10C, the mask 50 is again shifted and a blue luminescent material is patterned and deposited to form a blue luminescent layer 64.

In this embodiment, the second substrate 20 to be a screen is reinforced by the first substrate 10. Therefore, the warp and bending are not generated in the second substrate 20, reproducibility of selected deposition is high, and productivity is high. In this embodiment, in the mask 50, the plurality of openings 12 is formed in the first substrate 10, and the second substrates 20 are placed corresponding to the respective openings 12. Each of the second substrates 20 corresponds to a single EL device. More specifically, the mask 50 can be used to manufacture a plurality of integrated EL devices. The substrate 54 is cut out to obtain separate EL devices.

Figure 11:
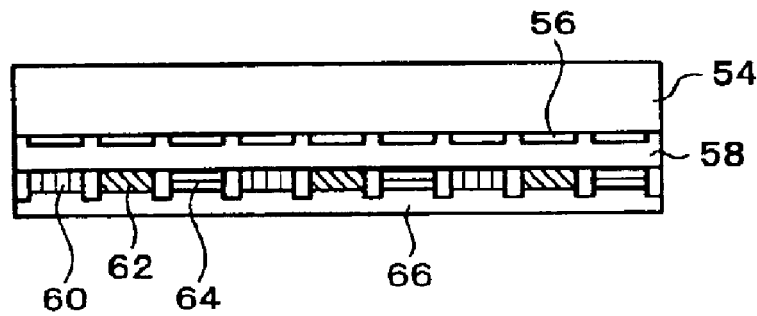
FIG. 11 shows the EL device manufactured by using the method of depositing the luminescent materials with the mask according to the embodiment of the present invention.

FIG. 11 shows an EL device manufactured through the method of depositing the luminescent materials as described above. The EL device (organic EL device, for example) has the substrate 54, the electrodes 56, the hole transport layer 58, and the luminescent layers 60, 62 and 64. Over the luminescent layers 60, 62 and 64, an electrode 66 is formed. The electrode 66 is a cathode electrode. The EL device (EL panel) is to be a display device (display).

Figure 12:
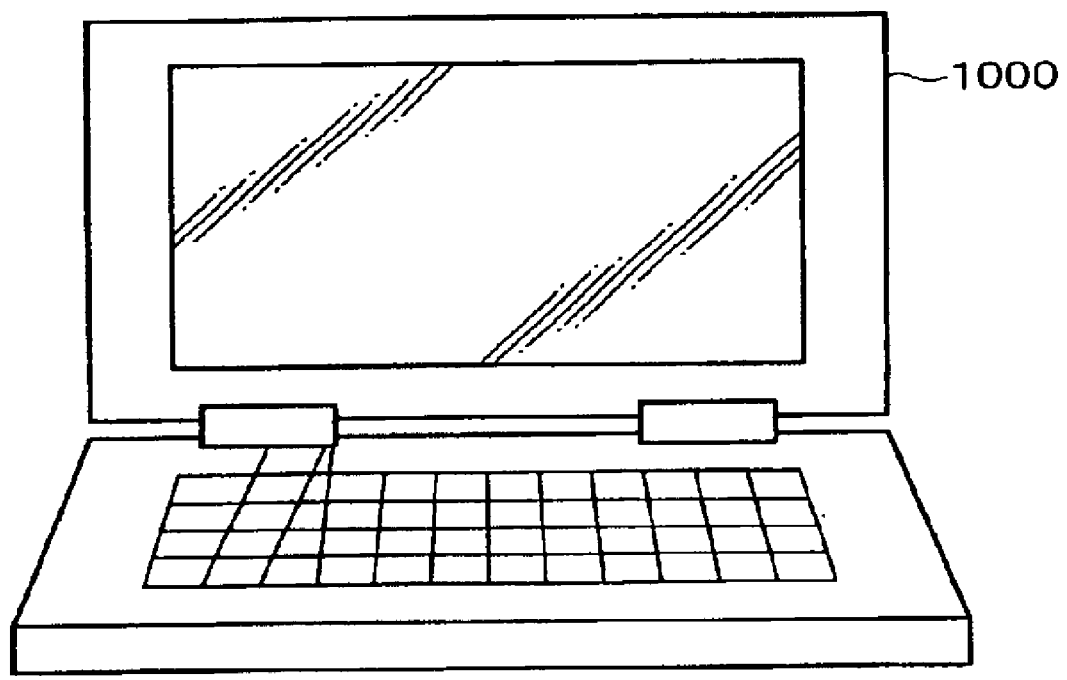
FIG. 12 shows an electronic instrument according to an embodiment of the present invention.
Figure 13:
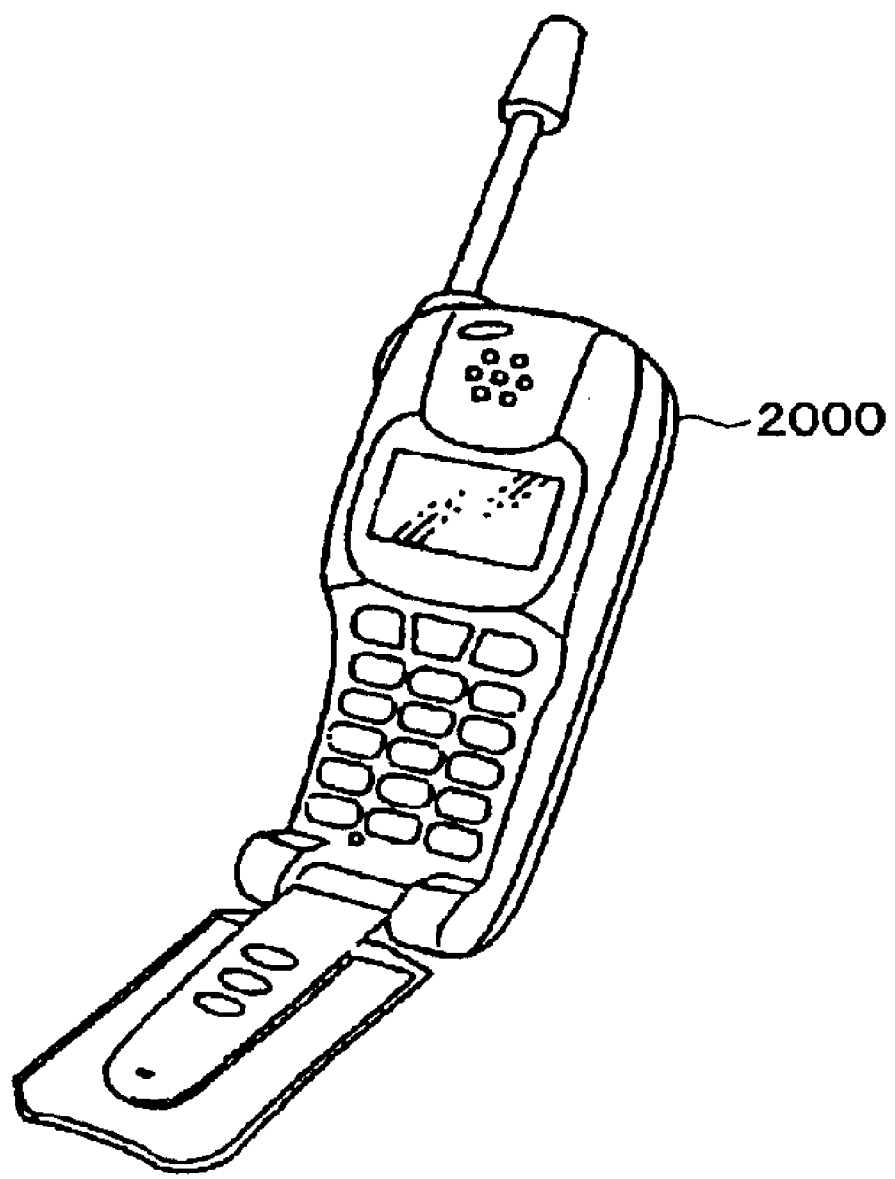
FIG. 13 shows an electronic instrument according to an embodiment of the present invention.

As an electronic instrument having the EL device in the embodiment of the present invention, FIG. 12 depicts a notebook-sized personal computer 1000, and FIG. 13 depicts a cellular phone 2000.

The present invention is not limited to the embodiment described above, which can be modified variously. For example, the present invention includes substantially the same configurations as the configurations described in this embodiment (for example, the configurations having the same functions, methods, and results, or the configurations having the same purposes and results). In addition, the present invention includes the configurations in which the unsubstantial portions of the configurations described in this embodiment are replaced. Furthermore, the present invention includes the configurations exerting the same effect and advantage or the configurations attaining the same purposes as those of the configurations described in this embodiment. Moreover, the present invention includes the configurations publicly known art added to the configurations described in this embodiment.

What is claimed is:

1. A method of manufacturing a mask comprising:

attaching to a first substrate formed with an opening a second substrate formed with a plurality of penetrating holes, wherein the plurality of penetrating holes are disposed inside the opening.

2. The method of manufacturing the mask as defined by claim 1, wherein the first substrate and the second substrate are joined together by anode coupling.

3. The method of manufacturing a mask as defined by claim 1, wherein the first substrate and the second substrate are adhered together by an energy curable adhesive.

4. The method of manufacturing a mask as defined by claim 1, wherein a step of forming the second substrate includes:

forming the plurality of penetrating holes in a silicon wafer; and cutting the silicon wafer into an outer shape of the second substrate.

5. The method of manufacturing a mask as defined by claim 1, wherein the first substrate has a first alignment mark, wherein the second substrate has a second alignment mark, and wherein the first and second alignment marks are used for positioning the second substrate and the first substrate when attaching the second substrate to the first substrate.

6. The method of manufacturing a mask as defined by claim 1, further comprising forming a mask positioning mark in at least one of the first and second substrates.

7. The method of manufacturing a mask as defined by claim 1, further comprising forming a magnetic film over the second substrate.

8. The method of manufacturing a mask as defined by claim 1, wherein a plurality of the second substrates is attached to the first substrate, wherein the first substrate is formed with a plurality of the openings, and wherein each of the second substrates corresponds with each of the openings when attaching the second substrates to the first substrate.

9. The method of manufacturing a mask as defined by claim 8, wherein the plurality of second substrates are detachably attached to the first substrate.

10. The method of manufacturing a mask as defined by claim 8, further comprising:

polishing surfaces of the plurality of second substrates attached to the first substrate so that heights of the second substrates become equal.

11. A mask comprising:

a first substrate formed with an opening; and a second substrate formed with a plurality of penetrating holes and attached to the first substrate, wherein the plurality of penetrating holes are disposed inside the opening.

12. The mask as defined by claim 11, wherein the first substrate and the second substrate are joined together by anode coupling.

13. The mask as defined by claim 11, wherein the first substrate and the second substrate are adhered together by an energy curable adhesive.

14. The mask as defined by claim 11, wherein the first substrate has a first alignment mark, wherein the second substrate has a second alignment mark, and wherein the first and second alignment marks are used for positioning the second substrate and the first substrate.

15. The mask as defined by claim 11, wherein a mask positioning mark is formed in at least one of the first and second substrates.

16. The mask as defined by claim 11, wherein a magnetic film is formed over the second substrate.

17. The mask as defined by claim 11, wherein a plurality of the second substrates is attached to the first substrate, wherein the first substrate is formed with a plurality of the openings, and wherein each of the second substrates corresponds with each of the openings when attaching the second substrates to the first substrate.

18. The mask as defined by claim 17, wherein the plurality of second substrates are detachably attached to the first substrate.

19. The mask as defined by claim 17, wherein surfaces of the plurality of second substrates attached to the first substrate are polished so that heights of the second substrates become equal.

20. A method of manufacturing an electroluminescence device comprising forming a film of luminescent material by using the mask as defined by claim 11.

21. An electroluminescence device manufactured by the method as defined by claim 20.

22. An electronic instrument having the electroluminescence device as defined by claim 21.

* * * * *